United States Patent
Lee et al.

(10) Patent No.: US 10,658,616 B2
(45) Date of Patent: May 19, 2020

(54) DISPLAY DEVICE AND METHOD OF FABRICATING THE SAME

(71) Applicant: Samsung Display Co., Ltd., Yongin-si, Gyeonggi-do (KR)

(72) Inventors: Cheho Lee, Suwon-si (KR); Soyeon Jeong, Hwaseong-si (KR); Shogo Nishizaki, Seoul (KR); Daesang Yun, Cheongju-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/150,032

(22) Filed: Oct. 2, 2018

(65) Prior Publication Data
US 2019/0123301 A1    Apr. 25, 2019

(30) Foreign Application Priority Data
Oct. 23, 2017 (KR) .................. 10-2017-0137695

(51) Int. Cl.
*H01L 51/52* (2006.01)
*H01L 51/56* (2006.01)
*H01L 27/32* (2006.01)

(52) U.S. Cl.
CPC ...... *H01L 51/5253* (2013.01); *H01L 51/5256* (2013.01); *H01L 51/56* (2013.01); *H01L 27/3244* (2013.01); *H01L 2251/301* (2013.01)

(58) Field of Classification Search
CPC .............. H01L 51/5253; H01L 51/524; H01L 51/5256
See application file for complete search history.

(56) References Cited

U.S. PATENT DOCUMENTS

| | | | |
|---|---|---|---|
| 8,461,760 B1 | 6/2013 | Oh et al. | |
| 9,627,647 B2 | 4/2017 | Kim et al. | |
| 2011/0042702 A1 | 2/2011 | Lim et al. | |
| 2011/0223434 A1 | 9/2011 | Roehrig et al. | |
| 2016/0093828 A1* | 3/2016 | Kim | H01L 51/5253 257/40 |
| 2018/0076417 A1* | 3/2018 | Song | H01L 51/5253 |
| 2019/0312230 A1* | 10/2019 | Ochi | H01L 51/5256 |
| 2019/0312232 A1* | 10/2019 | Yamazaki | H01L 51/5256 |

FOREIGN PATENT DOCUMENTS

| | | |
|---|---|---|
| KR | 10-2011-0087318 A | 8/2011 |
| KR | 10-2013-0128689 A | 11/2013 |
| KR | 10-1569406 B1 | 11/2015 |
| KR | 10-2016-0036722 A | 4/2016 |

\* cited by examiner

*Primary Examiner* — Changhyun Yi
(74) *Attorney, Agent, or Firm* — Lewis Roca Rothgerber Christie LLP (57) ABSTRACT

A display device may include an organic light emitting device and an encapsulation member provided on the organic light emitting device to seal the organic light emitting device. The encapsulation member may include a lower encapsulation layer, which is provided on the organic light emitting device and includes oxynitride and nitride, an organic layer provided on the lower encapsulation layer, and an upper encapsulation layer provided on the organic layer. A content of oxynitride in the lower encapsulation layer may increase with decreasing distance from the organic layer.

20 Claims, 10 Drawing Sheets

DISPLAY DEVICE AND METHOD OF FABRICATING THE SAME

CROSS-REFERENCE TO RELATED APPLICATION

This patent application claims priority to and the benefit of Korean Patent Application No. 10-2017-0137695, filed on Oct. 23, 2017 in the Korean Intellectual Property Office, the entire content of which is hereby incorporated by reference.

BACKGROUND

1. Field

Aspects of embodiments of the present disclosure relate to a display device, and a method of fabricating a display device.

2. Description of the Related Art

An organic light emitting display device includes an organic light emitting device, which is composed of an anode, an organic light emitting layer, and a cathode. The organic light emitting layer is very vulnerable to moisture or oxygen. For example, in a case in which external moisture or oxygen is infiltrated into the organic light emitting display device, the light emitting layer is deteriorated to cause various failures, such as dark spot and pixel shrinkage. Thus, an encapsulation structure is used to protect the organic light emitting device.

SUMMARY

According to aspects of embodiments of the inventive concept, a display device having an improved display quality and a method of fabricating the same are provided.

According to one or more embodiments of the inventive concept, a display device may include an organic light emitting device and an encapsulation member provided on the organic light emitting device to seal the organic light emitting device. The encapsulation member may include a lower encapsulation layer, which is provided on the organic light emitting device and includes oxynitride and nitride, an organic layer provided on the lower encapsulation layer, and an upper encapsulation layer provided on the organic layer. A content of oxynitride in the lower encapsulation layer may increase with decreasing distance from the organic layer.

In one or more embodiments, a ratio of oxynitride to nitride in the lower encapsulation layer may increase with decreasing distance from the organic layer.

In one or more embodiments, the nitride of the lower encapsulation layer may include at least one of silicon nitride, aluminum nitride, or titanium nitride.

In one or more embodiments, the lower encapsulation layer may include a first inorganic layer provided on the organic light emitting device, the first inorganic layer including nitride, a first intermediate inorganic layer provided on the first inorganic layer, the first intermediate inorganic layer including nitride and oxynitride, and a second inorganic layer provided on the first intermediate inorganic layer, the second inorganic layer including oxynitride. The second inorganic layer may be closer to the organic layer than the first inorganic layer, and a ratio of oxynitride to nitride in the first intermediate inorganic layer may increase with decreasing distance from the second inorganic layer.

In one or more embodiments, an oxynitride content of the first inorganic layer may be zero.

In one or more embodiments, the first intermediate inorganic layer may include a plurality of intermediate layers having oxynitride contents that are different from each other.

In one or more embodiments, the lower encapsulation layer may further include a second intermediate inorganic layer, which is provided on the second inorganic layer and includes oxide and oxynitride, and a content of oxide in the second intermediate inorganic layer may increase with decreasing distance from the organic layer.

In one or more embodiments, a ratio of oxide to oxynitride in the second intermediate inorganic layer may increase with decreasing distance from the organic layer.

In one or more embodiments, the lower encapsulation layer may further include a third inorganic layer, which is provided on the second intermediate inorganic layer and includes oxide.

In one or more embodiments, a refractive index of the second inorganic layer may be higher than a refractive index of the third inorganic layer.

According to one or more embodiments of the inventive concept, a method of fabricating a display device may include preparing an organic light emitting device, and forming an encapsulation member to seal the organic light emitting device. The forming of the encapsulation member may include depositing an inorganic material to form a lower encapsulation layer on the organic light emitting device, forming an organic layer on the lower encapsulation layer, and depositing an inorganic material to form an upper encapsulation layer on the organic layer. The forming of the lower encapsulation layer may include providing a first gas and a second gas on the organic light emitting device to form a first inorganic layer, the first gas including an inorganic compound and the second gas including nitrogen, and providing the first gas, the second gas, and a third gas on the lower encapsulation layer to form a first intermediate inorganic layer, the third gas including oxygen. The forming of the first intermediate inorganic layer may include gradually increasing a partial pressure of the third gas.

In one or more embodiments, the inorganic compound may include at least one of silicon, aluminum, or titanium.

In one or more embodiments, the forming of the lower encapsulation layer may be performed in a successive manner.

In one or more embodiments, the forming of the first intermediate inorganic layer may be performed while gradually reducing a partial pressure of the second gas.

In one or more embodiments, the second gas may include ammonia ($NH_3$).

In one or more embodiments, the third gas may include nitrous oxide ($N_2O$).

In one or more embodiments, the forming of the lower encapsulation layer may further include interrupting a supply of the second gas to form a second inorganic layer on the first intermediate inorganic layer.

In one or more embodiments, the increasing of the partial pressure of the third gas may include changing the partial pressure of the third gas in n different and stepwise-varying levels, where n is an integer that is equal to or greater than 10.

According to one or more embodiments of the inventive concept, a method of fabricating a display device may include preparing an organic light emitting device, and forming an encapsulation member to seal the organic light emitting device. The forming of the encapsulation member may include depositing an inorganic material on the organic light emitting device to form a lower encapsulation layer, forming an organic layer on the lower encapsulation layer, and depositing an inorganic material on the organic layer to form an upper encapsulation layer. The forming of the lower encapsulation layer may include providing a deposition gas on the organic light emitting device, the deposition gas including a first gas including an inorganic compound, a second gas including nitrogen, and a third gas including oxygen, and the providing of the deposition gas may be performed to gradually increase a partial pressure of oxygen and to gradually decrease a partial pressure of nitrogen.

BRIEF DESCRIPTION OF THE DRAWINGS

Embodiments will be more clearly understood from the following description taken in conjunction with the accompanying drawings. The accompanying drawings represent some non-limiting, example embodiments as described herein.

These figures are intended to illustrate general characteristics of methods, structures, and/or materials utilized in certain example embodiments and to supplement the written description provided below. These drawings may not, however, be to scale and may not precisely reflect the precise structural or performance characteristics of any given embodiment, and should not be interpreted as limiting the range of values or properties encompassed by example embodiments. For example, the relative thicknesses and positioning of layers, regions, and/or structural elements may be reduced or exaggerated for clarity. The use of similar or same reference numerals in the various drawings is intended to indicate the presence of a similar or same element or feature.

DETAILED DESCRIPTION

Some example embodiments of the inventive concepts will now be described more fully with reference to the accompanying drawings, in which some example embodiments are shown. Embodiments of the inventive concepts may, however, be embodied in many different forms and should not be construed as being limited to the example embodiments set forth herein; rather, these example embodiments are provided so that this disclosure will be thorough and complete, and will fully convey the concept of embodiments to those of ordinary skill in the art. In the drawings, the thicknesses of layers and regions may be exaggerated for clarity. Like reference numerals in the drawings denote like elements, and thus their repeated description may be omitted.

It is to be understood that when an element is referred to as being "connected" or "coupled" to another element, it may be directly connected or coupled to the other element or one or more intervening elements may be present. In contrast, when an element is referred to as being "directly connected" or "directly coupled" to another element, there are no intervening elements present. Like numbers indicate like elements throughout. As used herein, the term "and/or" includes any and all combinations of one or more of the associated listed items. Other words used to describe a relationship between elements or layers should be interpreted in a like fashion (e.g., "between" versus "directly between," "adjacent" versus "directly adjacent," "on" versus "directly on").

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a "first" element, component, region, layer, or section discussed below could be termed a "second" element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below.

The terminology used herein is for the purpose of describing particular embodiments and is not intended to be limiting of embodiments. As used herein, the singular forms "a," "an," and "the" are intended to include the plural forms as well, unless the context clearly indicates otherwise. It is to be further understood that the terms "comprises," "comprising," "includes," and/or "including," as used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which embodiments of the inventive concepts belong. It is to be further understood that terms, such as those defined in commonly-used dictionaries, should be interpreted as having a meaning that is consistent with their meaning in the context of the relevant art and are not be interpreted in an idealized or overly formal sense unless expressly so defined herein.

Figure 1:
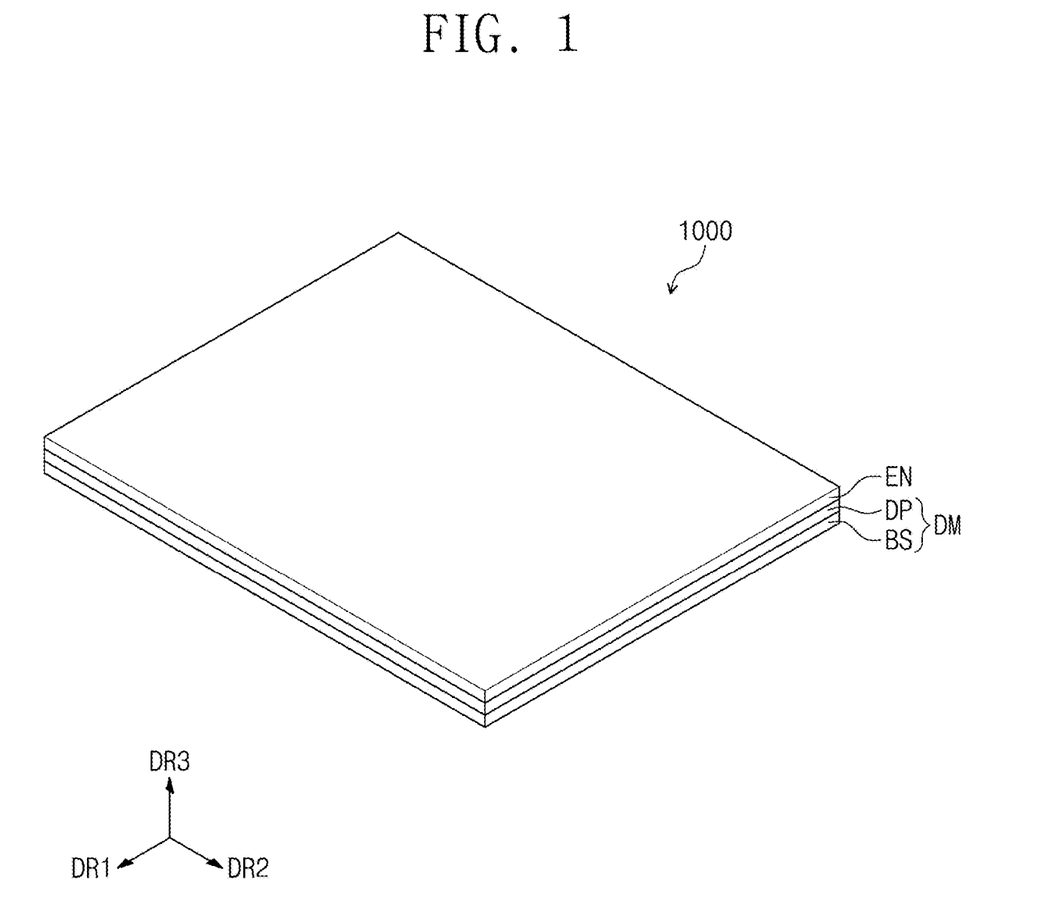
FIG. 1 is a perspective view illustrating a display device according to one or more embodiments of the inventive concept.
Figure 2:
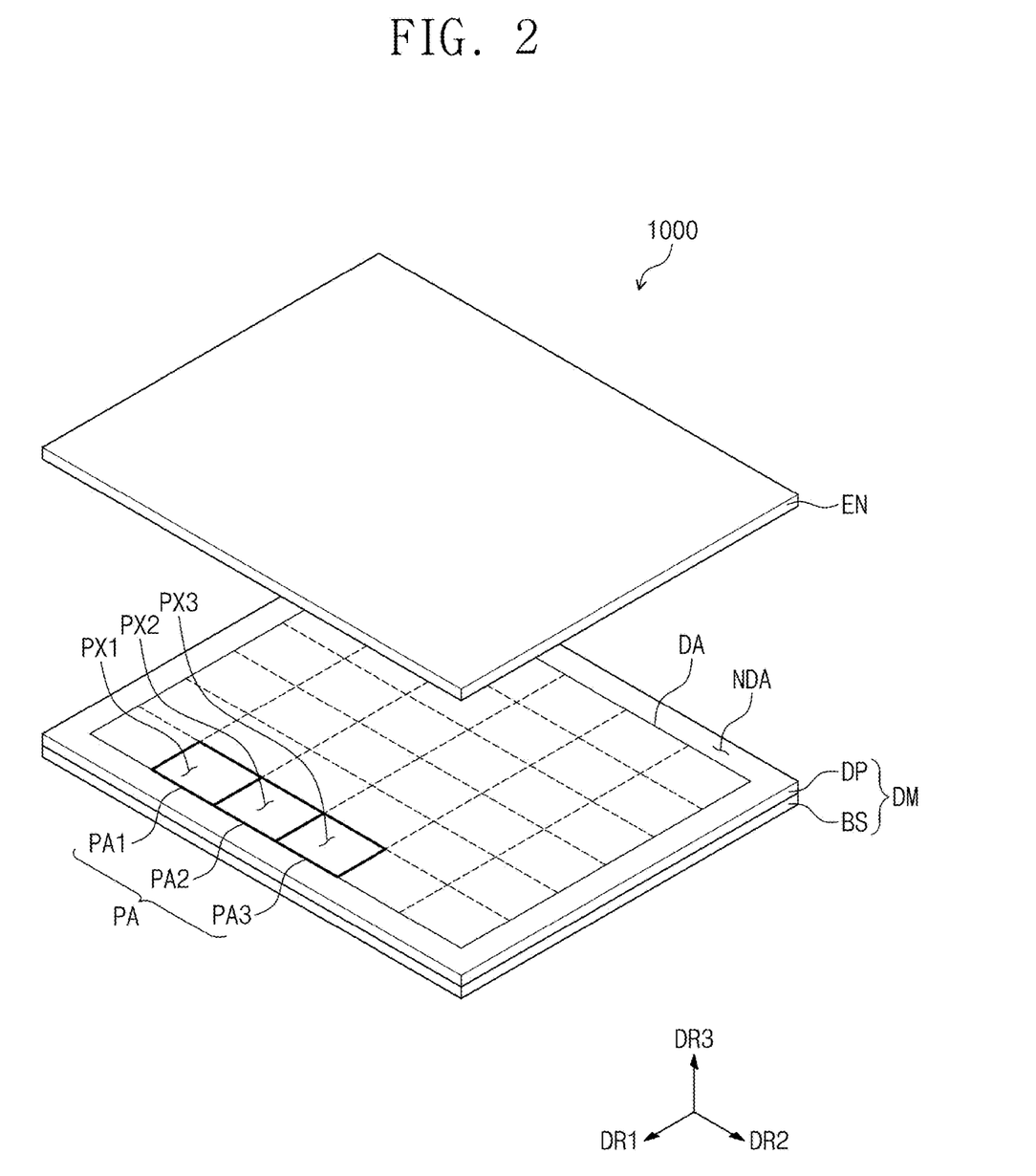
FIG. 2 is an exploded perspective view illustrating the display device of FIG. 1.
Figure 3:
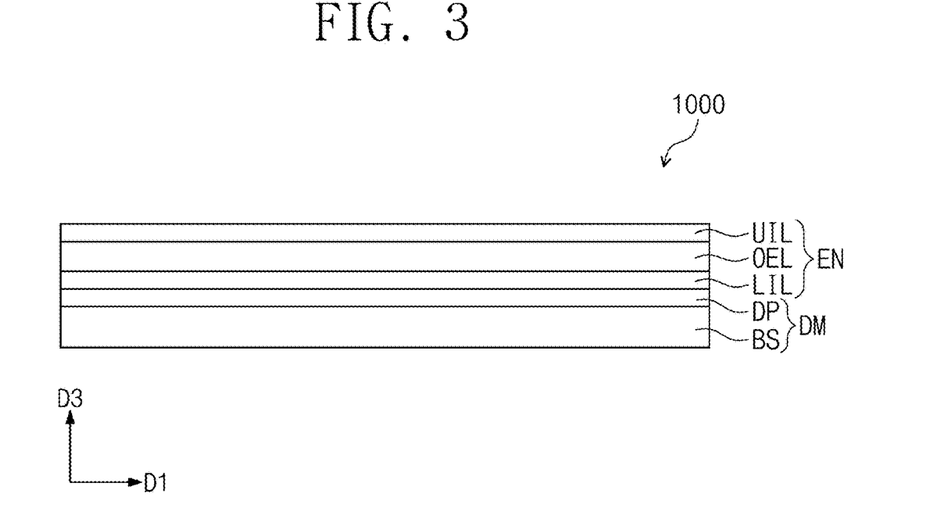
FIG. 3 is a cross-sectional view illustrating the display device of FIG. 1.
Figure 4:
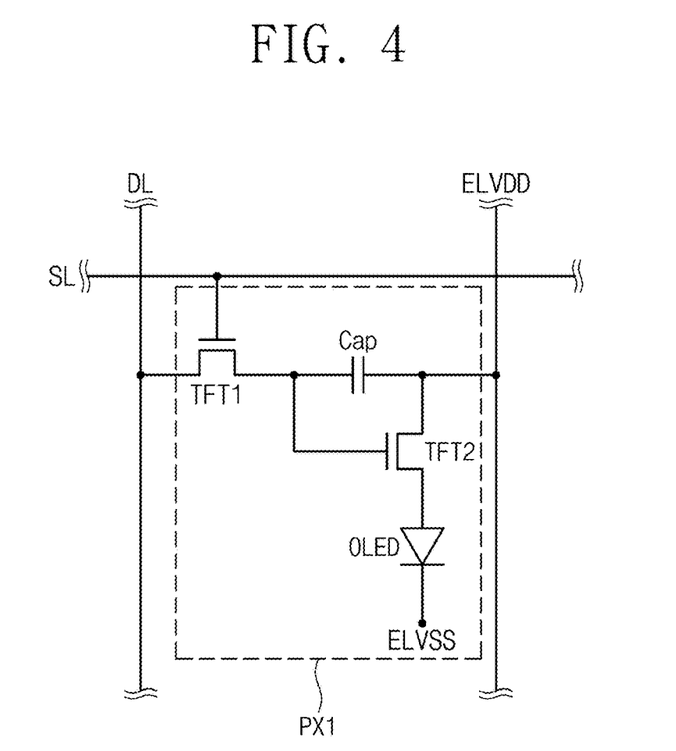
FIG. 4 is a circuit diagram of one of pixels, which are included in a display device according to one or more embodiments of the inventive concept.

FIG. 1 is a perspective view illustrating a display device according to one or more embodiments of the inventive concept; FIG. 2 is an exploded perspective view illustrating the display device of FIG. 1; FIG. 3 is a cross-sectional view illustrating the display device of FIG. 1; and FIG. 4 is a circuit diagram of one of pixels, which are included in a display device according to one or more embodiments of the inventive concept.

Referring to FIGS. 1 to 4, a display device 1000 may include a display member DM and an encapsulation member EN.

The display member DM may be configured to display an image in response to an electrical signal applied thereto. For example, the display member DM may be an organic light emitting display panel.

The display member DM may include a display region DA and a non-display region NDA. The display region DA may be configured to display an image. When viewed in a plan view or thickness direction of the display device 1000, the display region DA may have a generally rectangular shape, but the inventive concept is not limited thereto.

The display region DA may include a plurality of pixel regions PA. The pixel regions PA may be arranged in a matrix shape, when viewed in a plan view defined by a first direction DR1 and a second direction DR2. However, the inventive concept is not limited thereto, and the pixel regions PA may be arranged in various shapes.

Figure 5:
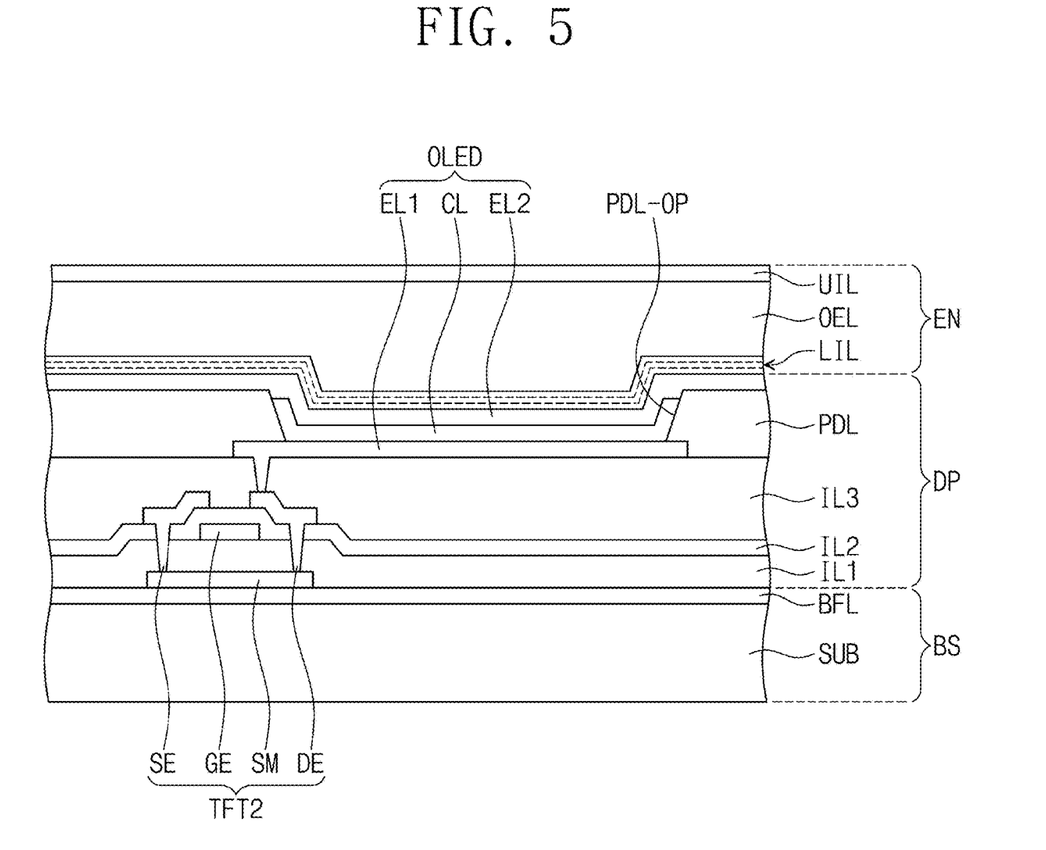
FIG. 5 is a cross-sectional view schematically illustrating a portion of a display device according to one or more embodiments of the inventive concept.

The pixel regions PA may be defined by a pixel definition layer PDL (e.g., see FIG. 5). A plurality of pixels (e.g., PX1-PX3) may be provided in the pixel regions PA (e.g., PA1-PA3), respectively. Each of the pixels PX1-PX3 may include an organic light emitting device OLED (e.g., see FIG. 5).

The pixels PX1-PX3 may include a first pixel PX1, a second pixel PX2, and a third pixel PX3. The first to third pixels PX1-PX3 may be configured to emit light beams whose colors or wavelengths are different from each other. For example, the first pixel PX1 may be configured to emit a first color light, the second pixel PX2 may be configured to emit a second color light, and the third pixel PX3 may be configured to emit a third color light. Combination of the lights to be emitted from the pixel regions PA may be variously changed to display an image on the display member DM.

The non-display region NDA may not be used to display an image. In an embodiment, when viewed in the plan view or thickness direction of the display device 1000 (herein, a third direction DR3), the non-display region NDA may be provided to surround the display region DA.

In the present embodiment, the third direction DR3 may be orthogonal to both of the first direction DR1 and the second direction DR2. The third direction DR3 may be parallel to an upward or downward direction to be described below. Herein, front and rear surfaces of each of elements to be described below will be differentiated based on the third direction DR3. However, the directions indicated by the upward and downward directions may be a relative concept, and in certain embodiments, they may be changed to indicate other directions.

The display member DM may include a base member BS and a display layer DP, which is provided on the base member BS.

The base member BS may be a substrate made of an insulating material (e.g., glass, plastic, or quartz). The display layer DP may include the plurality of pixels. Each of the pixels may be configured to emit light in response to electrical signals applied thereto.

For convenience of illustration, an equivalent circuit diagram of one (e.g., the first pixel PX1) of the plurality of the pixels PX1-PX3 is exemplarily illustrated in FIG. 4. According to one or more embodiments of the inventive concept, each of the pixels PX1-PX3 may have a structure corresponding to the first pixel PX1, but the inventive concept is not limited thereto.

Referring to FIG. 4, the first pixel PX1 may include a first transistor TFT1, a capacitor Cap, a second transistor TFT2, and an organic light emitting device OLED. The first transistor TFT1 may include a control electrode connected to a first signal line SL, an input electrode connected to a second signal line DL, and an output electrode.

The first transistor TFT1 may serve as a switching device to control an on/off switching operation of the first pixel PX1. For example, the first transistor TFT1 may be used to transmit a data signal from the second signal line DL to the capacitor Cap or the second transistor TFT2 or to prevent such transmission of the data signal, in response to a scan signal transmitted through the first signal line SL.

The capacitor Cap may include a first capacitor electrode, which is connected to the first transistor TFT1, and a second capacitor electrode, which is used to receive a first power voltage ELVDD. The capacitor Cap may be configured to store charges, and an amount of the charges stored in the capacitor Cap may be determined by a difference between a voltage corresponding to the data signal, which is transmitted through the first transistor TFT1, and the first power voltage ELVDD.

The second transistor TFT2 may include a control electrode, which is connected to the output electrode of the first transistor TFT1 and the first capacitor electrode of the capacitor Cap, an input electrode, which is used to receive the first power voltage ELVDD, and an output electrode. The output electrode of the second transistor TFT2 may be connected to the organic light emitting device OLED.

The second transistor TFT2 may control a driving current flowing through the organic light emitting device OLED, based on an amount of charges stored in the capacitor Cap. A turn-on time of the second transistor TFT2 may be determined depending on an amount of charges stored in the capacitor Cap. In one or more embodiments, a voltage, which is supplied to the organic light emitting device OLED through the output electrode of the second transistor TFT2, may be substantially lower than the first power voltage ELVDD.

The organic light emitting device OLED may be connected to the second transistor TFT2 to receive a second power voltage ELVSS. The organic light emitting device OLED may emit light when the second transistor TFT2 is turned-on.

The organic light emitting device OLED may include an electroluminescent material. A color of light to be emitted from the organic light emitting device OLED may be determined depending on the kind of the electroluminescent material. In one or more embodiments, the color of light to be emitted from the organic light emitting device OLED may be one of red, green, blue, and white.

The encapsulation member EN may be placed on the display member DM. The encapsulation member EN may be provided to cover the display layer DP. The encapsulation member EN may be configured to protect the display layer DP from moisture or a contamination material from the outside.

The encapsulation member EN may include a lower encapsulation layer LIL, an organic layer OEL, and an upper encapsulation layer UIL. The encapsulation member EN will be described in more detail with reference to FIGS. 6 to 8.

FIG. 5 is a cross-sectional view schematically illustrating a portion of a display device according to one or more embodiments of the inventive concept. For convenience of illustration, FIG. 5 exemplarily illustrates a region in which a portion of the first pixel PX1 of FIG. 4 is provided.

Referring to FIG. 5, the base member BS may include a base layer SUB and a buffer layer BFL. A material of the base layer SUB is not particularly limited and may be commonly used. For example, the base layer SUB may be formed of an insulating material (e.g., glass, plastic, quartz, etc.). In an embodiment, the base layer SUB may include an organic polymer, such as polyethylene terephthalate (PET), polyethylene naphthalate (PEN), polyimide, and polyethersulfone. A material for the base layer SUB may be selected in consideration of various physical or chemical properties, such as mechanical strength, thermal stability, transparency, surface flatness, tractability, and a waterproofing property.

A functional layer may be provided on the base layer SUB. FIG. 5 illustrates an example in which the buffer layer BFL is used as the functional layer, but the functional layer may include a barrier layer. The buffer layer BFL may be used to improve adhesion characteristics between the base member BS and the display layer DP, and the barrier layer may be used to prevent or substantially prevent an extraneous material from being infiltrated into the display layer DP.

The display layer DP may include a second thin-film transistor, such as the second transistor TFT2, and the organic light emitting device OLED.

The second transistor TFT2 may include a driving thin-film transistor, which is used to control the organic light emitting device OLED, and a switching thin-film transistor, which is used to control a switching operation of the driving thin-film transistor.

The second transistor TFT2 may include a semiconductor layer SM, a control electrode GE, an input electrode SE, and an output electrode DE. The semiconductor layer SM may be formed of a semiconductor material and may be used as an active layer of the second transistor TFT2. The semiconductor layer SM may be formed of at least one of inorganic or organic semiconductor materials.

A first insulating layer IL1 may be provided on the semiconductor layer SM. The first insulating layer IL1 may be provided to cover the semiconductor layer SM. The first insulating layer IL1 may be formed of or include at least one of organic insulating materials or inorganic insulating materials.

The control electrode GE and a second insulating layer IL2 may be sequentially provided on the first insulating layer IL1. The control electrode GE may be formed to cover a region corresponding to a channel region of the semiconductor layer SM. The input electrode SE and the output electrode DE may be provided on the second insulating layer IL2. The output electrode DE may be connected to the semiconductor layer SM through a contact hole, which is formed to penetrate the first insulating layer IL1 and the second insulating layer IL2.

A third insulating layer IL3 may be provided on the input electrode SE, the output electrode DE, and the second insulating layer IL2. The third insulating layer IL3 may serve as a protection layer to protect the second thin-film transistor TFT2 and may also serve as a planarization layer with a flat top surface.

The organic light emitting device OLED may be provided on the third insulating layer IL3. The organic light emitting device OLED may include a first electrode EL1, a second electrode EL2 provided on the first electrode EL1, and a light intermediate layer CL provided between the first electrode EL1 and the second electrode EL2.

The first electrode EL1 may be used as a pixel electrode or a positive electrode. The first electrode EL1 may be a transparent electrode, a transflective electrode, or a reflective electrode. In the case in which the first electrode EU is the transparent electrode, the first electrode EL1 may be formed of or include a transparent metal oxide (e.g., indium tin oxide (ITO), indium zinc oxide (IZO), zinc oxide (ZnO), or indium tin zinc oxide (ITZO)). In the case in which the first electrode EL1 is the transflective or reflective electrode, the first electrode EL1 may be formed of or include at least one of metallic materials (e.g., any of Ag, Mg, Al, Pt, Pd, Au, Ni, Nd, Ir, and Cr).

The second electrode EL2 may be a common electrode or a negative electrode. The second electrode EL2 may be a transparent electrode, a transflective electrode, or a reflective electrode. In the case in which the second electrode EL2 is the transparent electrode, the second electrode EL2 may be formed of or include at least one of Li, Ca, LiF/Ca, LiF/Al, Al, Mg, BaF, Ba, Ag, compounds thereof, or mixtures thereof (e.g., a mixture of Ag and Mg), but the inventive concept is not limited thereto. For example, the second electrode EL2 may be formed of or include indium tin oxide (ITO), indium zinc oxide (IZO), zinc oxide (ZnO), or indium tin zinc oxide (ITZO). In the case in which the second electrode EL2 is the transflective or reflective electrode, the second electrode EL2 may be formed of or include at least one of Ag, Mg, Al, Pt, Pd, Au, Ni, Nd, Ir, Cr, Li, Ca, LiF/Ca, LiF/Al, Mo, Ti, compounds thereof, or mixtures thereof (e.g., a mixture of Ag and Mg). In one or more embodiments, the second electrode EL2 may be provided to have a multi-layered structure including a reflective or semi-transparent layer (e.g., any of the above-described materials) and a transparent conductive layer (e.g., of indium tin oxide (ITO), indium zinc oxide (IZO), zinc oxide (ZnO), or indium tin zinc oxide (ITZO)).

In one or more embodiments, the first electrode EL1 may be a reflective electrode, and the second electrode EL2 may be a transflective or transparent electrode. The organic light emitting display device 1000 may be configured to include the organic light emitting device OLED that is of a top-emission type. However, the inventive concept is not limited thereto, and the organic light emitting device OLED may be of a bottom-emission type.

The pixel definition layer PDL may be placed on the first electrode EL1. For example, the pixel definition layer PDL may be provided to cover a portion of the first electrode EU and to expose another portion of the first electrode EL1. In an embodiment, the pixel definition layer PDL may be formed of or include at least one of metal-fluoride ion compounds, but the inventive concept is not limited thereto. For example, the pixel definition layer PDL may be formed of one of metal-fluoride ion compounds, such as LiF, BaF2, and CsF. If the metal-fluoride ion compound is formed to have a thickness larger than a certain thickness, it may have an insulating property.

The pixel definition layer PDL may be provided to define an opening PDL-OP. The opening PDL-OP of the pixel definition layer PDL may define a light-emitting region.

The light intermediate layer CL may be provided between the first electrode EL1 and the second electrode EL2. In one or more embodiments, the light intermediate layer CL comprises a light emitting layer. In an embodiment, the light intermediate layer CL may further include a plurality of common layers, in addition to the light emitting layer. For example, the light intermediate layer CL may include a hole injection layer, a hole transport layer, a light emitting layer, an electron transport layer, and an electron injection layer, which are sequentially stacked on the base layer SUB. In one or more embodiments, the light intermediate layer CL may further include at least one of a hole prevention layer, a hole buffer layer, or an electron prevention layer.

The light intermediate layer CL may be provided in the opening PDL-OP defined in the pixel definition layer PDL. The light intermediate layer CL may be overlapped with the light-emitting region defined by the opening PDL-OP of the pixel definition layer PDL.

The lower encapsulation layer LIL may be provided on the display layer DP to be in direct contact with the display layer DP. For example, the lower encapsulation layer LIL may be provided to be in contact with the second electrode EL2 of the organic light emitting device OLED. The lower encapsulation layer LIL may include an inorganic compound. For example, the lower encapsulation layer LIL may include at least one of silicon compounds, aluminum compounds, or titanium compounds.

The lower encapsulation layer LIL may be used to seal the organic light emitting device OLED and may also be used as a barrier layer preventing or substantially preventing an extraneous material from infiltrating into the organic light emitting device OLED. To allow the organic light emitting device OLED to have an increased light-emitting efficiency, the lower encapsulation layer LIL may be configured to have an optically transparent property, but in one or more embodiments, although not shown, the lower encapsulation layer LIL may include a plurality of thin layers. This will be described in more detail with reference to FIGS. 6 to 8.

The organic layer OEL may be provided on the lower encapsulation layer LIL. The organic layer OEL may be formed of or include an organic compound. For example, the organic layer OEL may be configured to have a relatively large thickness, compared with other layers adjacent thereto. As an example, the organic layer OEL may be thicker than each of the lower encapsulation layer LIL and the upper encapsulation layer UIL. The organic layer OEL may serve as a protection layer to protect the organic light emitting device OLED and may also serve as a planarization layer with a flat top surface.

The upper encapsulation layer UIL may be provided on the organic layer OEL. The upper encapsulation layer UIL may be formed of or include an inorganic compound. For example, the upper encapsulation layer UIL may include at least one of silicon compounds, aluminum compounds, or titanium compounds.

The upper encapsulation layer UIL may be provided to cover the organic layer OEL, and this may make it possible to prevent or substantially prevent the organic layer OEL from being in contact with or exposed to the outside. Furthermore, the upper encapsulation layer UIL may prevent or substantially prevent moisture or the like in the organic layer OEL from being exhausted to the outside.

Figure 6:
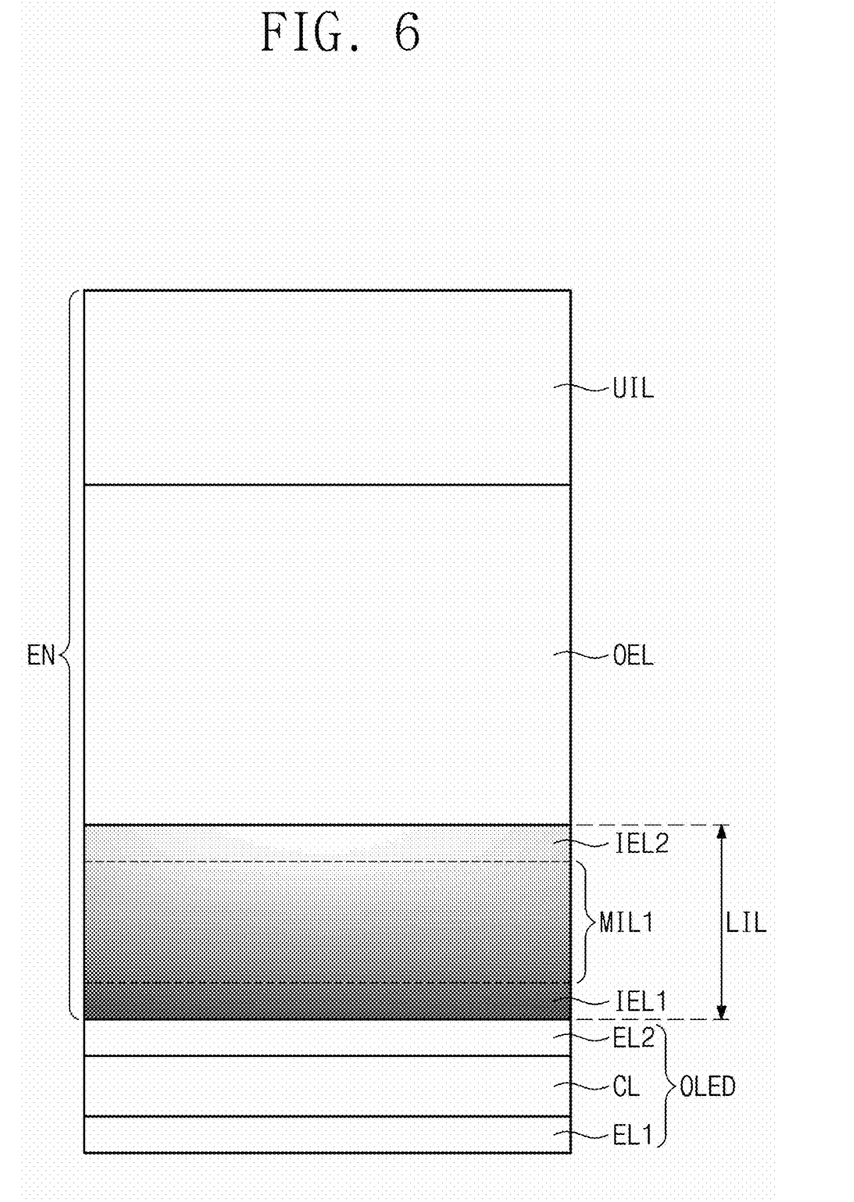
FIG. 6 is an enlarged cross-sectional view illustrating an encapsulation member according to one or more embodiments of the inventive concept.
Figure 7:
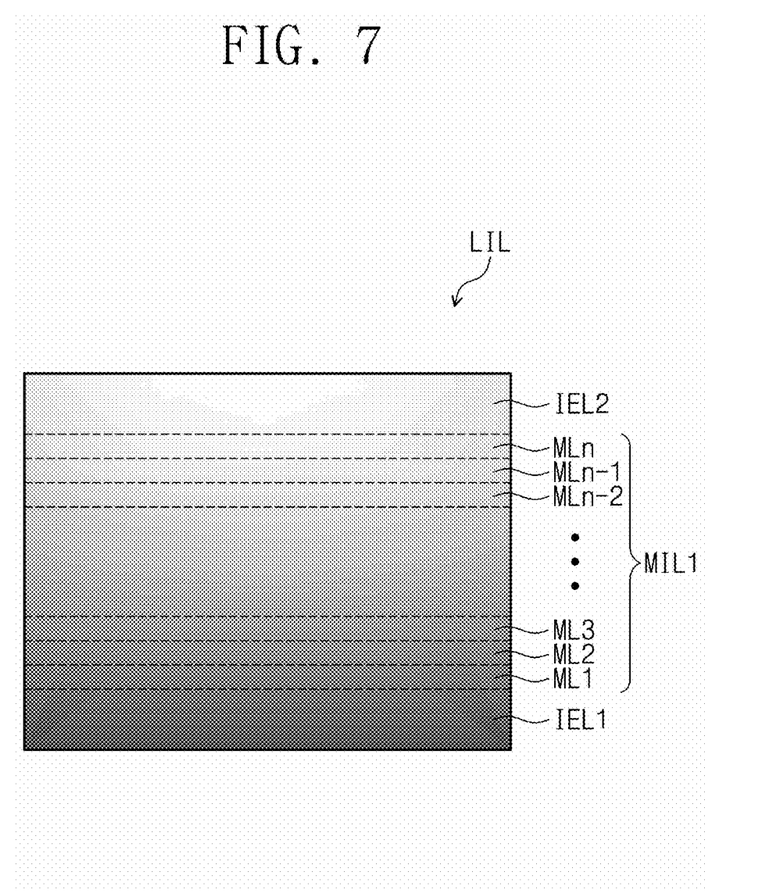
FIG. 7 is an enlarged cross-sectional view illustrating a lower encapsulation layer shown in FIG. 6.

FIG. 6 is an enlarged cross-sectional view illustrating an encapsulation member according to one or more embodiments of the inventive concept; and FIG. 7 is an enlarged cross-sectional view illustrating a lower encapsulation layer shown in FIG. 6.

Referring to FIGS. 6 and 7, the lower encapsulation layer LIL, according to one or more embodiments of the inventive concept, may include a first inorganic layer IEL1, a second inorganic layer IEL2, and a first intermediate inorganic layer MIL1.

The first inorganic layer IEL1 may be provided on the display member DM. The first inorganic layer IEL1 may include nitride. For example, the first inorganic layer IEL1 may include at least one of silicon nitride (SiNx), aluminum nitride (AlNx), or titanium nitride (TiNx).

The second inorganic layer IEL2 may be provided on the first inorganic layer IEL1. In other words, the second inorganic layer IEL2 may be provided between the organic layer OEL and the first inorganic layer IEL1. The second inorganic layer IEL2 may include oxynitride. For example, the second inorganic layer IEL2 may include at least one of silicon oxynitride ($SiO_xN_y$), aluminum oxynitride ($AlO_xN_y$), or titanium oxynitride ($TiO_xN_y$).

The first intermediate inorganic layer MIL1 may be provided between the first inorganic layer IEL1 and the second inorganic layer IEL2. The first intermediate inorganic layer MIL1 may include nitride and oxynitride. In one or more embodiments, the shorter the distance from the second inorganic layer IEL2, the higher the ratio of oxynitride to nitride in the first intermediate inorganic layer MIL1. In other words, the content of the oxynitride in the first intermediate inorganic layer MIL1 may increase with decreasing distance from the second inorganic layer IEL2.

In one or more embodiments, the first intermediate inorganic layer MIL1 may include first to n-th intermediate layers ML1-MLn, where n is an integer greater than 1. In an embodiment, the value of n may be greater than or equal to 10. However, the inventive concept is not limited to a specific value for n.

The first to n-th intermediate layers ML1-MLn may be sequentially provided in the upward direction. In other words, the first intermediate layer ML1 may be the lowermost layer of the first intermediate inorganic layer MIL1, and the n-th intermediate layer MLn may be the uppermost layer of the first intermediate inorganic layer MIL1. The second to (n−1)-th intermediate layers ML2-MLn−1 may be sequentially stacked between the first intermediate layer ML1 and the n-th intermediate layer MLn.

In one or more embodiments, the first to n-th intermediate layers ML1-MLn may be provided to have oxynitride-to-nitride ratios different from each other. The first to n-th intermediate layers ML1-MLn may have oxynitride-to-nitride ratios increasing in the upward direction or in the order listed. That is, the oxynitride-to-nitride ratio in the first intermediate inorganic layer MIL1 may be lowest in the first intermediate layer ML1 and may be highest in the n-th intermediate layer MLn.

In an embodiment, the first inorganic layer IEL1 may not include oxynitride, and the second inorganic layer IEL2 may not include nitride. In other words, the oxynitride content of the first inorganic layer IEL1 may be zero, and the nitride content of the second inorganic layer IEL2 may be zero. However, the inventive concept is not limited thereto. For example, in certain embodiments, the first inorganic layer IEL1 may include a very small amount of oxynitride, and the second inorganic layer IEL2 may include a very small amount of nitride.

In the present embodiment, the first inorganic layer IEL1 in direct contact with the organic light emitting device OLED may have a superior barrier property, compared with the second inorganic layer IEL2. Thus, it may be possible to effectively prevent or substantially prevent the organic light emitting device OLED from being damaged and thereby increase a life span of the organic light emitting device OLED. In other words, it may be possible to improve durability of the display device 1000.

Furthermore, in the present embodiment, the second inorganic layer IEL2 may have an oxygen content higher than that of the first inorganic layer IEL1. Thus, the second inorganic layer IEL2 may have transmittance higher than that of the first inorganic layer IEL1. This may make it possible to increase a light-emitting efficiency of the display device 1000.

Figure 8:
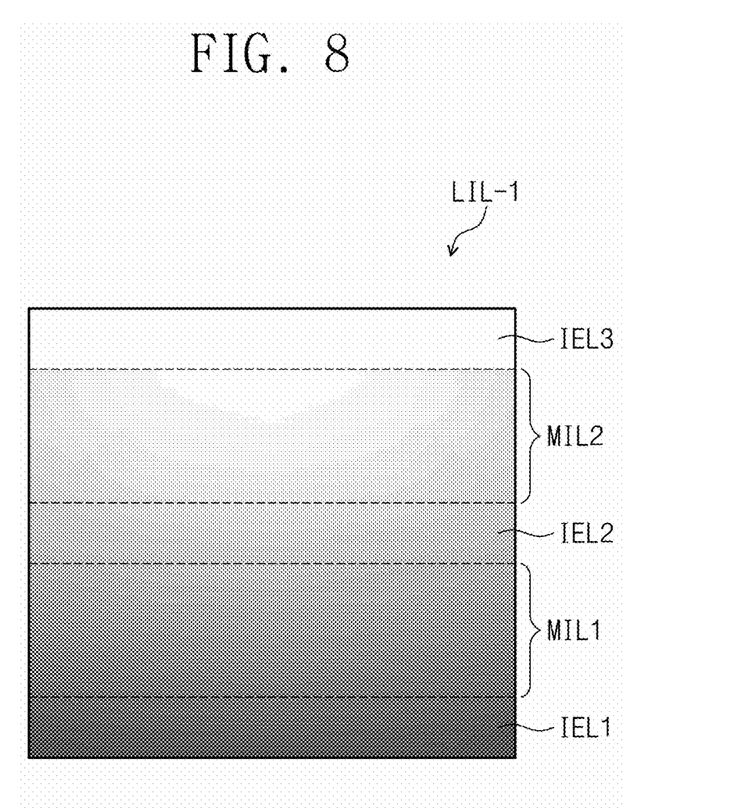
FIG. 8 is an enlarged cross-sectional view illustrating a lower encapsulation layer according to one or more embodiments of the inventive concept.

FIG. 8 is an enlarged cross-sectional view illustrating a lower encapsulation layer according to one or more embodiments of the inventive concept.

For concise description, a previously described element may be identified by a similar or same reference number without repeating an overlapping description thereof. Other elements that are not separately described may be configured to have substantially the same technical features as those in the previously described embodiments.

Referring to FIG. 8, a lower encapsulation layer LIL-1, according to one or more embodiments of the inventive concept, may further include a third inorganic layer IEL3 and a second intermediate inorganic layer MIL2.

The third inorganic layer IEL3 may be provided over the second inorganic layer IEL2. The third inorganic layer IEL3 may include oxide. For example, the third inorganic layer IEL3 may include at least one of silicon oxide ($SiO_x$), aluminum oxide ($AlO_x$), or titanium oxide ($TiO_x$).

The second intermediate inorganic layer MIL2 may be provided between the second inorganic layer IEL2 and the third inorganic layer IEL3. The second intermediate inorganic layer MIL2 may include oxynitride and oxide. In one or more embodiments, a ratio of oxide to oxynitride in the second intermediate inorganic layer MIL2 may increase with decreasing distance from the third inorganic layer IEL3. In other words, a content of oxide in the second intermediate inorganic layer MIL2 may increase with decreasing distance from the third inorganic layer IEL3.

In an embodiment, a refractive index of the organic layer OEL may be lower than a mean refractive index of the lower encapsulation layer LIL. In a case in which, unlike the present embodiment, the third inorganic layer IEL3 and the second intermediate inorganic layer MIL2 are not provided, light provided from the display layer DP may be reflected by an interface between the organic layer OEL and the lower encapsulation layer LIL. This may lead to a reduction in light-emitting efficiency of the display device 1000. By contrast, according to the present embodiment, the third inorganic layer IEL3 may be provided to have an oxygen content higher than that of the second inorganic layer IEL2. Furthermore, the second intermediate inorganic layer MIL2 may be provided to have an oxygen content gradually increasing in the upward direction. Thus, the refractive index may decrease in a direction from the second inorganic layer IEL2 toward the third inorganic layer IEL3. Accordingly, it may be possible to reduce an amount of light, which is provided from the display layer DP and is reflected by an interface between the organic layer OEL and the lower encapsulation layer LIL-1. In other words, light-emitting efficiency of the display device 1000 may be increased.

Herein, a method of fabricating a display device, such as the display device described with reference to FIGS. 1 to 7, will be described with reference to FIGS. 9 to 11E. For concise description, a previously described element may be identified by a similar or same reference number without repeating an overlapping description thereof.

Figure 9:
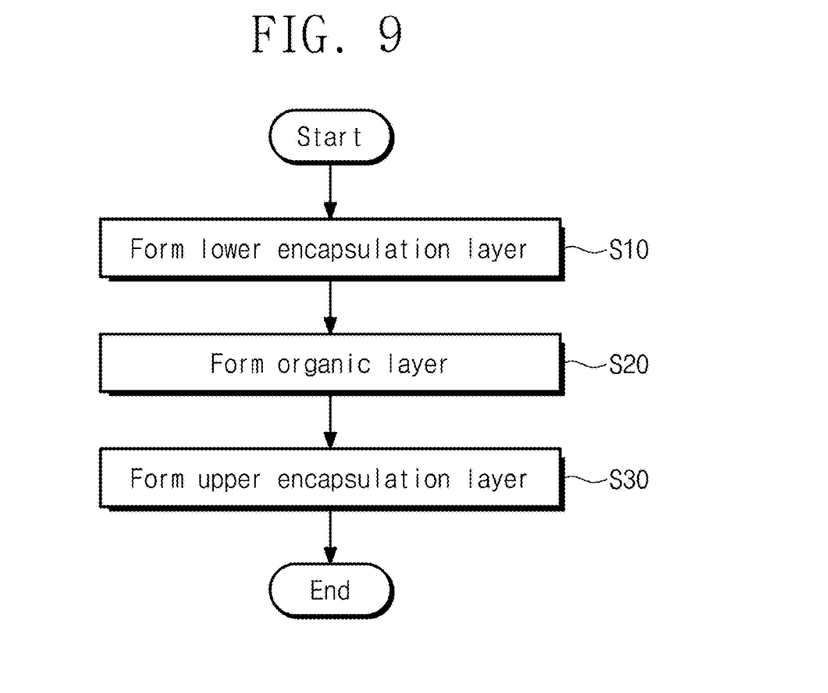
FIG. 9 is a flowchart illustrating some steps of a method of fabricating a display device, according to one or more embodiments of the inventive concept.

FIG. 9 is a flowchart illustrating some steps of a method of fabricating a display device, according to one or more embodiments of the inventive concept.

A method of fabricating a display device, according to one or more embodiments of the inventive concept, may include preparing a display member and forming an encapsulation member on the display member. The display member may include an organic light emitting device, and the encapsulation member may be formed to seal the organic light emitting device.

FIG. 9 illustrates a process of forming the encapsulation member according to one or more embodiments of the inventive concept. The process of forming the encapsulation member may include forming the lower encapsulation layer LIL on the organic light emitting device (S10), forming the organic layer OEL on the lower encapsulation layer LIL (S20), and forming the upper encapsulation layer UIL on the organic layer OEL (S30).

The lower encapsulation layer LIL may be formed by depositing an inorganic compound. For example, the inorganic compound may include at least one of silicon compounds, aluminum compounds, or titanium compounds.

The organic layer OEL may be formed by depositing an organic compound. In an embodiment, the organic layer OEL may be formed to have a thickness larger than that of each of the lower encapsulation layer LIL and the upper encapsulation layer UIL.

The upper encapsulation layer UIL may be formed by depositing an inorganic compound. For example, the inorganic compound may include at least one of silicon compounds, aluminum compounds, or titanium compounds.

Figure 10:
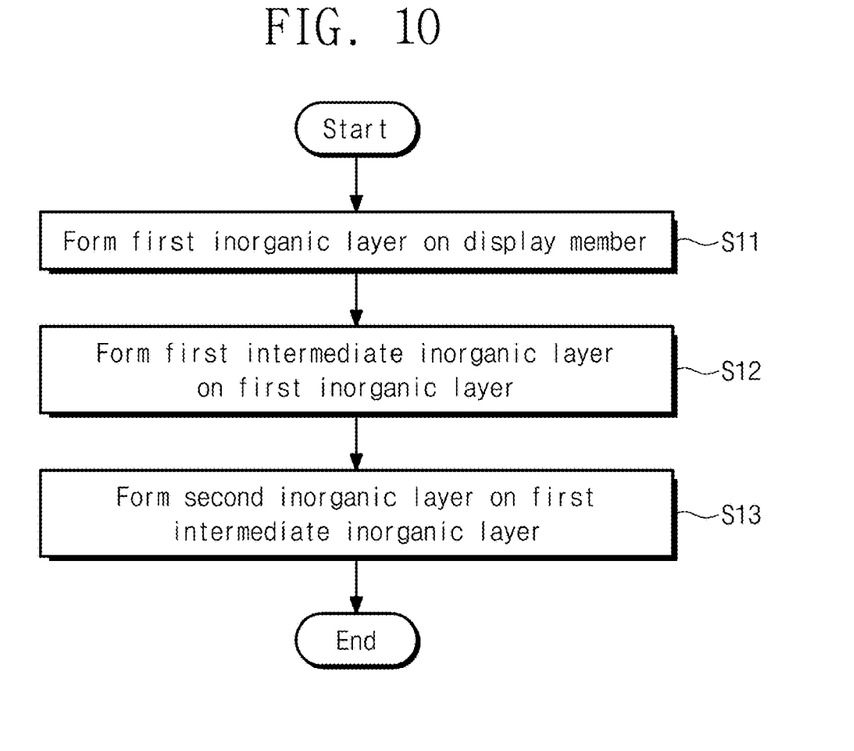
FIG. 10 is a flowchart illustrating a step of forming a lower encapsulation layer shown in FIG. 9.

FIG. 10 is a flowchart illustrating a step of forming a lower encapsulation layer shown in FIG. 9; and FIGS. 11A to 11E are cross-sectional views sequentially illustrating a process of forming a lower encapsulation layer.

Referring to FIGS. 10 and 11A to 11E, the forming of the lower encapsulation layer may include forming the first inorganic layer IEL1 on the display member DM (S11), forming the first intermediate inorganic layer MIL1 on the first inorganic layer IEL1 (S12), and forming the second inorganic layer IEL2 on the first intermediate inorganic layer MIL1 (S13). In an embodiment, the steps for forming the lower encapsulation layer may be successively performed in the same chamber.

Figure 11A:
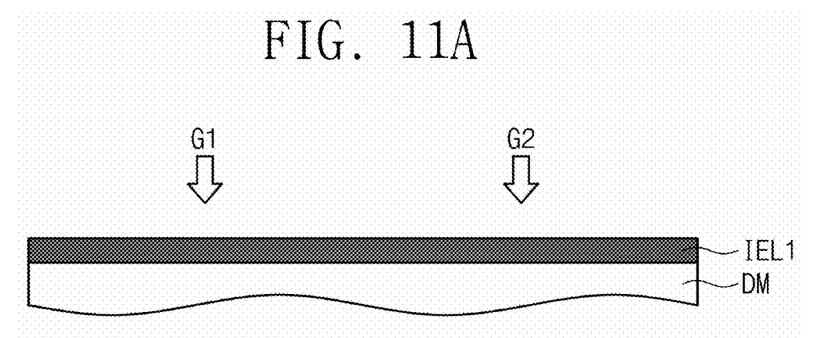
FIGS. 11A to 11E are cross-sectional views sequentially illustrating a process of forming a lower encapsulation layer, according to one or more embodiments of the inventive concept.

As shown in FIG. 11A, the first inorganic layer IEL1 may be provided on the display member DM (S11). In an embodiment, a first gas G1 and a second gas G2 may be provided on the display member DM. The first gas G1 may include an inorganic compound. For example, the first gas G1 may include at least one of silane ($SiH_4$), aluminum hydride ($AlH_4$), or titanium hydride ($TiH_4$). The second gas G2 may include nitrogen. For example, the second gas G2 may include ammonia ($NH_3$).

As a result of reaction between the first gas G1 and the second gas G2, the first inorganic layer IEL1 may be formed on the display member DM. The first inorganic layer IEL1 may include nitride. The first inorganic layer IEL1 may include at least one of silicon nitride ($SiN_x$), aluminum nitride ($AlN_x$), or titanium nitride ($TiN_x$).

Figure 11B:
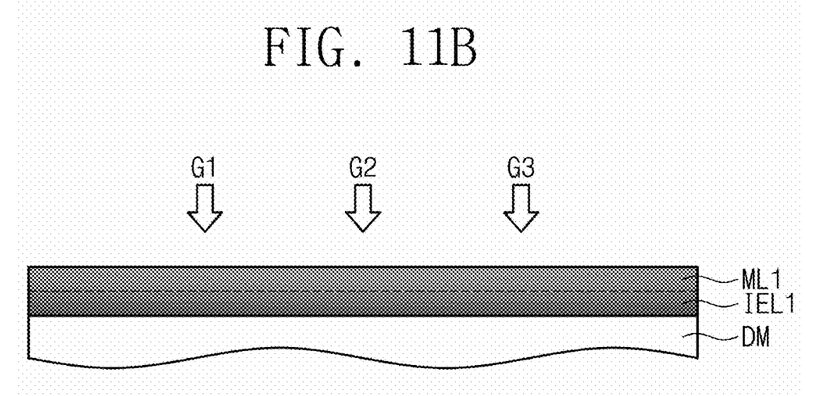
Figure 11C:
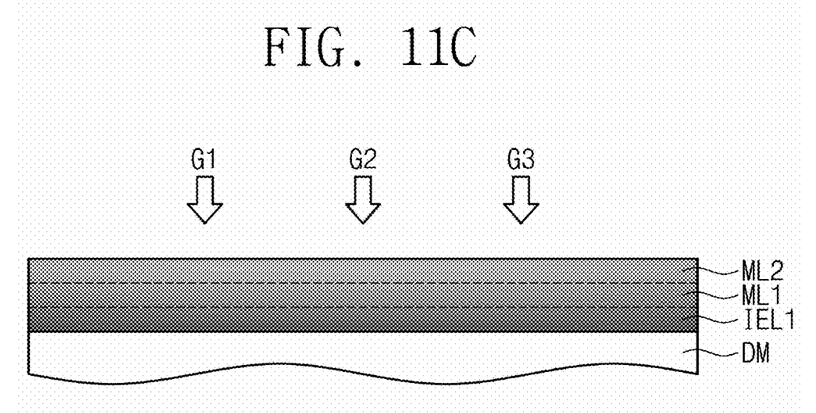
Figure 11D:
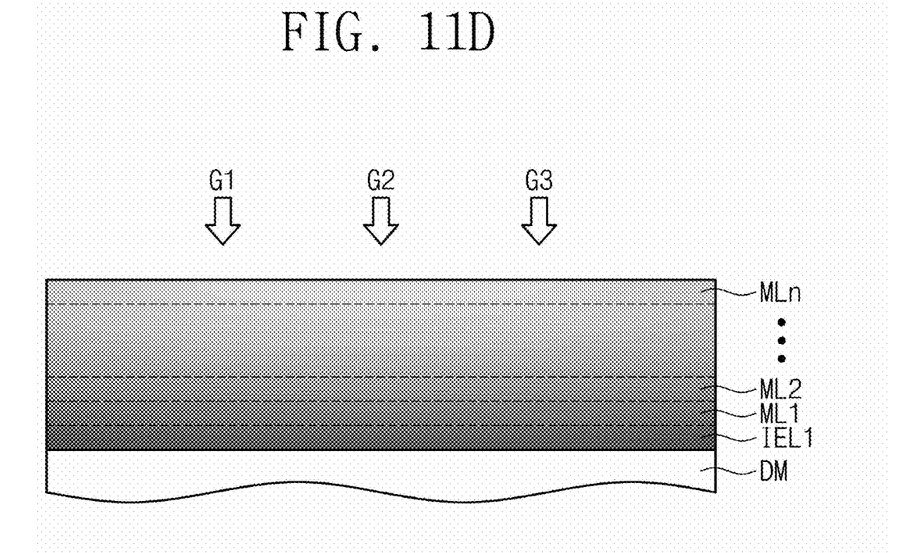

As shown in FIGS. 11B to 11D, the first intermediate inorganic layer MIL1 may be formed on the first inorganic layer IEL1 (S12). The formation of the first intermediate inorganic layer MIL1 may include sequentially forming the first to n-th intermediate layers ML1-MLn.

The first to n-th intermediate layers ML1-MLn may be formed as a result of reaction between the first and second gases G1 and G2 and a third gas G3. The third gas G3 may include oxygen. For example, the third gas G3 may be nitrous oxide ($N_2O$). The first to n-th intermediate layers ML1-MLn may include nitride and oxynitride. The oxynitride may include at least one of silicon oxynitride ($SiO_xN_y$), aluminum oxynitride ($AlO_xN_y$), or titanium oxynitride ($TiO_xN_y$).

In the present embodiment, when the first intermediate layer ML1 to the n-th intermediate layer MLn are formed, a partial pressure of the third gas G3 may be gradually increased in the formation order thereof. In an embodiment, the partial pressure of the third gas G3 may be increased in a stepwise manner, when the first intermediate layer ML1 to the n-th intermediate layer MLn are formed, and, for example, the partial pressures of the third gas G3 may be divided into ten or more levels or degrees increasing in a stepwise manner. In addition, the partial pressure of the second gas G2 may be gradually decreased. In an embodiment, the partial pressure of the second gas G2 may be decreased in a stepwise manner when the first intermediate layer ML1 to the n-th intermediate layer MLn are formed.

Since the partial pressure of the third gas G3 is increased in the order from the first intermediate layer ML1 to the n-th intermediate layer MLn, the ratio of oxynitride to nitride may be increased in the order from the first intermediate layer ML1 to the n-th intermediate layer MLn.

Figure 11E:
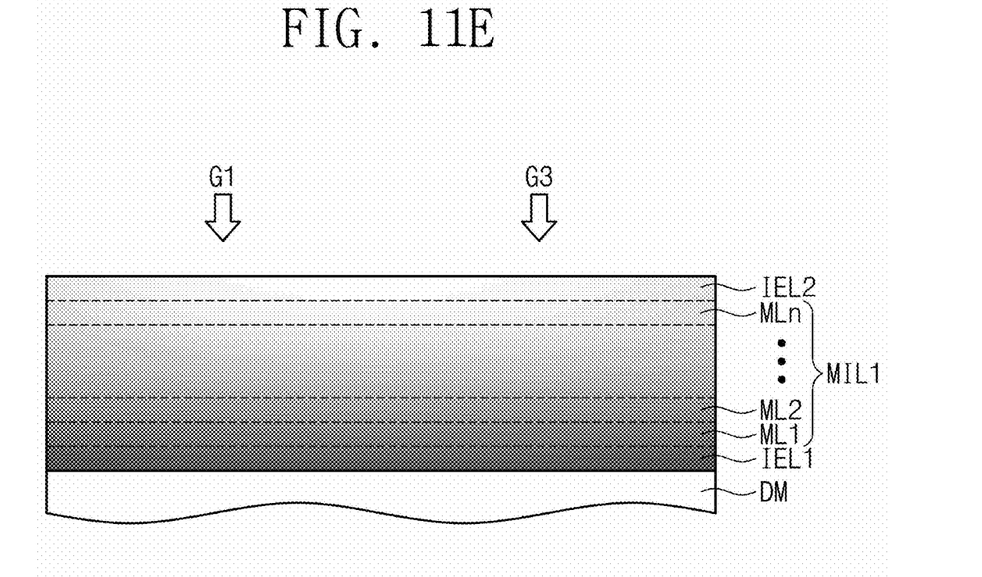

As shown in FIG. 11E, the second inorganic layer IEL2 may be formed on the n-th intermediate layer MLn. In an embodiment, the second inorganic layer IEL2 may be formed by interrupting the supply of the second gas G2. In other words, the second inorganic layer IEL2 may be formed as a result of reaction between only the first and third gases G1 and G3. Thus, the second inorganic layer IEL2 may include only oxynitride.

According to embodiments of the inventive concept, a display device may have an improved display quality.

While some example embodiments of the inventive concepts have been shown and described, it will be understood by one of ordinary skill in the art that variations in form and detail may be made therein without departing from the spirit and scope of the inventive concepts as set forth in the attached claims.

What is claimed is:

1. A display device comprising:
an organic light emitting device; and
an encapsulation member on the organic light emitting device to seal the organic light emitting device,
wherein the encapsulation member comprises:
a lower encapsulation layer on the organic light emitting device, the lower encapsulation layer including oxynitride and nitride;
an organic layer on the lower encapsulation layer; and
an upper encapsulation layer on the organic layer,
wherein a content of oxynitride in the lower encapsulation layer increases with decreasing distance from the organic layer, the lower encapsulation layer including both oxynitride and nitride at a first distance from the organic layer along a thickness direction of the lower encapsulation layer.

2. The display device of claim 1, wherein a ratio of oxynitride to nitride in the lower encapsulation layer increases with decreasing distance from the organic layer.

3. The display device of claim 1, wherein the nitride of the lower encapsulation layer comprises at least one of silicon nitride, aluminum nitride, or titanium nitride.

4. A display device comprising:
an organic light emitting device; and
an encapsulation member on the organic light emitting device to seal the organic light emitting device,
wherein the encapsulation member comprises:
a lower encapsulation layer on the organic light emitting device, the lower encapsulation layer including oxynitride and nitride;
an organic layer on the lower encapsulation layer; and
an upper encapsulation layer on the organic layer,
wherein a content of oxynitride in the lower encapsulation layer increases with decreasing distance from the organic layer,
wherein the lower encapsulation layer comprises:
a first inorganic layer on the organic light emitting device, the first inorganic layer comprising nitride;
a first intermediate inorganic layer on the first inorganic layer, the first intermediate inorganic layer comprising nitride and oxynitride; and
a second inorganic layer on the first intermediate inorganic layer, the second inorganic layer comprising oxynitride,
wherein the second inorganic layer is closer to the organic layer than the first inorganic layer, and
a ratio of oxynitride to nitride in the first intermediate inorganic layer increases with decreasing distance from the second inorganic layer.

5. The display device of claim 4, wherein an oxynitride content of the first inorganic layer is zero.

6. The display device of claim 4, wherein the first intermediate inorganic layer comprises a plurality of intermediate layers having oxynitride contents that are different from each other.

7. The display device of claim 6, wherein the plurality of intermediate layers comprises ten or more intermediate layers.

8. The display device of claim 4, wherein the lower encapsulation layer further comprises a second intermediate inorganic layer, which is on the second inorganic layer and comprises oxide and oxynitride, and
a content of oxide in the second intermediate inorganic layer increases with decreasing distance from the organic layer.

9. The display device of claim 8, wherein a ratio of oxide to oxynitride in the second intermediate inorganic layer increases with decreasing distance from the organic layer.

10. The display device of claim 8, wherein the lower encapsulation layer further comprises a third inorganic layer, which is on the second intermediate inorganic layer and comprises oxide.

11. The display device of claim 10, wherein a refractive index of the second inorganic layer is higher than a refractive index of the third inorganic layer.

12. A method of fabricating a display device, the method comprising:
preparing an organic light emitting device; and
forming an encapsulation member to seal the organic light emitting device,
wherein the forming of the encapsulation member comprises:
depositing an inorganic material to form a lower encapsulation layer on the organic light emitting device, the lower encapsulation layer including oxynitride and nitride, wherein a content of oxynitride in the lower encapsulation layer increases with decreasing distance from the organic layer, the lower encapsulation layer including both oxynitride and nitride at a first distance from the organic layer along a thickness direction of the lower encapsulation layer;

forming an organic layer on the lower encapsulation layer; and depositing an inorganic material to form an upper encapsulation layer on the organic layer, wherein the forming of the lower encapsulation layer comprises:

providing a first gas and a second gas on the organic light emitting device to form a first inorganic layer, the first gas comprising an inorganic compound and the second gas comprising nitrogen; and providing the first gas, the second gas, and a third gas on the lower encapsulation layer to form a first intermediate inorganic layer, the third gas comprising oxygen, wherein the forming of the first intermediate inorganic layer comprises gradually increasing a partial pressure of the third gas.

13. The method of claim 12, wherein the inorganic compound comprises at least one of silicon, aluminum, or titanium.

14. The method of claim 12, wherein the forming of the lower encapsulation layer is performed in a successive manner.

15. The method of claim 12, wherein the forming of the first intermediate inorganic layer is performed while gradually reducing a partial pressure of the second gas.

16. The method of claim 12, wherein the second gas comprises ammonia.

17. The method of claim 12, wherein the third gas comprises nitrous oxide.

18. The method of claim 12, wherein the forming of the lower encapsulation layer further comprises interrupting a supply of the second gas to form a second inorganic layer on the first intermediate inorganic layer.

19. The method of claim 12, wherein the increasing of the partial pressure of the third gas comprises changing the partial pressure of the third gas in n different and stepwise-varying levels, where n is an integer that is equal to or greater than 10.

20. A method of fabricating a display device, the method comprising:

preparing an organic light emitting device; and forming an encapsulation member to seal the organic light emitting device, wherein the forming of the encapsulation member comprises:

depositing an inorganic material on the organic light emitting device to form a lower encapsulation layer, the lower encapsulation layer including oxynitride and nitride, wherein a content of oxynitride in the lower encapsulation layer increases with decreasing distance from the organic layer, the lower encapsulation layer including both oxynitride and nitride at a first distance from the organic layer along a thickness direction of the lower encapsulation layer;

forming an organic layer on the lower encapsulation layer; and depositing an inorganic material on the organic layer to form an upper encapsulation layer, wherein the forming of the lower encapsulation layer comprises providing a deposition gas on the organic light emitting device, the deposition gas comprising a first gas including an inorganic compound, a second gas including nitrogen, and a third gas including oxygen, and the providing of the deposition gas is performed to gradually increase a partial pressure of oxygen and to gradually decrease a partial pressure of nitrogen.

* * * * *